United States Patent

Nowak et al.

[11] Patent Number: 6,057,204
[45] Date of Patent: May 2, 2000

[54] METHOD OF MAKING A NOISE-ISOLATED BURIED RESISTOR BY IMPLANTING A FIRST WELL WITH A MASK AND THEN IMPLANTING AN OPPOSITE CONDUCTIVITY WELL WITH A LARGER OPENING IN THE MASK

[75] Inventors: Edward J. Nowak; Xiaowei Tian; Minh H. Tong, all of Essex, Vt.

[73] Assignee: International Business Machines Corporation, Armonk, N.Y.

[21] Appl. No.: 09/229,334

[22] Filed: Jan. 13, 1999

Related U.S. Application Data

[62] Division of application No. 08/804,601, Feb. 24, 1997, Pat. No. 5,883,566.

[51] Int. Cl.$^7$ .................................................. H01L 21/20
[52] U.S. Cl. ........................... 438/382; 338/311; 257/536
[58] Field of Search .................... 438/381, 382, 438/383, 385, 428; 257/536, 537, 538

[56] References Cited

U.S. PATENT DOCUMENTS

| | | | |
|---|---|---|---|
| 3,386,865 | 6/1968 | Doo | 438/353 |
| 3,534,234 | 10/1970 | Clevenger | 257/515 |
| 3,966,577 | 6/1976 | Hochberg | 438/412 |
| 3,970,486 | 7/1976 | Kooi | 257/626 |
| 4,212,083 | 7/1980 | Rao | 365/154 |
| 4,228,450 | 10/1980 | Anantha et al. | 257/540 |
| 4,316,319 | 2/1982 | Anantha et al. | 438/331 |
| 4,418,469 | 12/1983 | Fujita | 438/332 |
| 4,672,584 | 6/1987 | Tsuji et al. | 365/226 |
| 4,725,810 | 2/1988 | Foroni et al. | 338/226 |
| 4,786,880 | 11/1988 | Voorman | 330/294 |
| 4,868,537 | 9/1989 | Blanchard | 338/308 |
| 5,073,508 | 12/1991 | Villalon | 438/314 |
| 5,200,733 | 4/1993 | Davis et al. | 338/64 |
| 5,352,994 | 10/1994 | Black et al. | 333/33 |
| 5,436,177 | 7/1995 | Zaccherini | 438/385 |
| 5,440,162 | 8/1995 | Worley et al. | 257/355 |
| 5,506,528 | 4/1996 | Cao et al. | 327/108 |
| 5,729,043 | 3/1998 | Shepard | 257/519 |
| 5,874,771 | 2/1999 | Hurkx et al. | 257/536 |

*Primary Examiner*—Charles Bowers
*Assistant Examiner*—William Brewster
*Attorney, Agent, or Firm*—Whitham, Curtis & Whitham; Eugene I. Shkurko, Esq.

[57] ABSTRACT

A noise-isolated buried resistor satisfies the requirements for low-noise analog designs requiring well controlled ohmic resistors. A field shield is provided between the buried resistor and the substrate to isolate the buried resistor from the substrate noise. This is accomplished by using the standard buried resistor layout and mask sequence with two exceptions. First, the buried resistor is placed in an N-well region, rather than simply a P-well region. Second, a boron implant is added through the buried resistor mask to provide a P-well inside the N-well to isolate the buried resistor electrically from the N-well. The N-well may then be electrically connected to a "quiet" ground. The P-well inside of the N-well may be left floating.

4 Claims, 5 Drawing Sheets

METHOD OF MAKING A NOISE-ISOLATED BURIED RESISTOR BY IMPLANTING A FIRST WELL WITH A MASK AND THEN IMPLANTING AN OPPOSITE CONDUCTIVITY WELL WITH A LARGER OPENING IN THE MASK

This application is a divisional application of U.S. patent application Ser. No. 08/804,601, filed Feb. 24, 1997, now U.S. Pat. No. 5,883,566.

BACKGROUND OF THE INVENTION

1. Field of the Invention

The present invention generally relates to electrical resistors fabricated in very large scale integrated (VLSI) analog circuits and, more particularly, to a low-noise ohmic buried resistor fabricated using complementary metal oxide semiconductor (CMOS) technology.

2. Background Description

The buried resistor is a standard element in complementary metal oxide semiconductor (CMOS) technologies. It consists, for example, of an N+ doped region in a P-type substrate (or P-well) and, as such, is strongly coupled to any noise present in the substrate. This prohibits use of the resistor in applications requiring low noise elements, such as analog circuits.

Another type of resistor used in certain types of integrated circuit (IC) technologies is a polysilicon on thick oxide structure that provides lower capacitance to the substrate and thus better noise immunity. These resistors can also be built over an N-well in order to use the N-well as a field shield to further reduce noise coupling to the substrate. However, this type of resistor is not generally compatible with certain CMOS technologies. Furthermore, the buried resistor has much greater heat dissipation capability and is less expensive to manufacture, thus generally more desirable for many applications apart from its poor noise isolation characteristics.

SUMMARY OF THE INVENTION

It is therefore an object of the present invention to provide a noise-isolated buried resistor that satisfies the requirements for low-noise analog designs requiring well controlled ohmic resistors.

According to the invention, there is provided a field shield between the buried resistor and the substrate to isolate the buried resistor from the substrate noise. This is accomplished by using the standard buried resistor layout and mask sequence with two exceptions. First, the buried resistor is placed in an N-well region, rather than simply in a P-well region. Second, a boron implant is added through the buried resistor mask to provide a P-well inside the N-well to isolate the buried resistor electrically from the N-well. The N-well may then be electrically connected to a "quiet" ground. The P-well inside of the N-well may be left floating.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
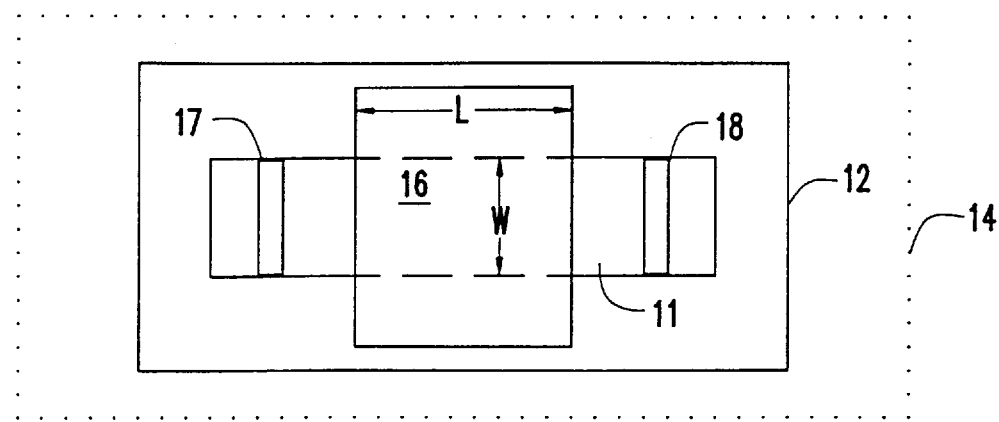
FIG. 1 is a plan view showing the layout of the noise isolated buried resistor according to the invention.
Figure 2:
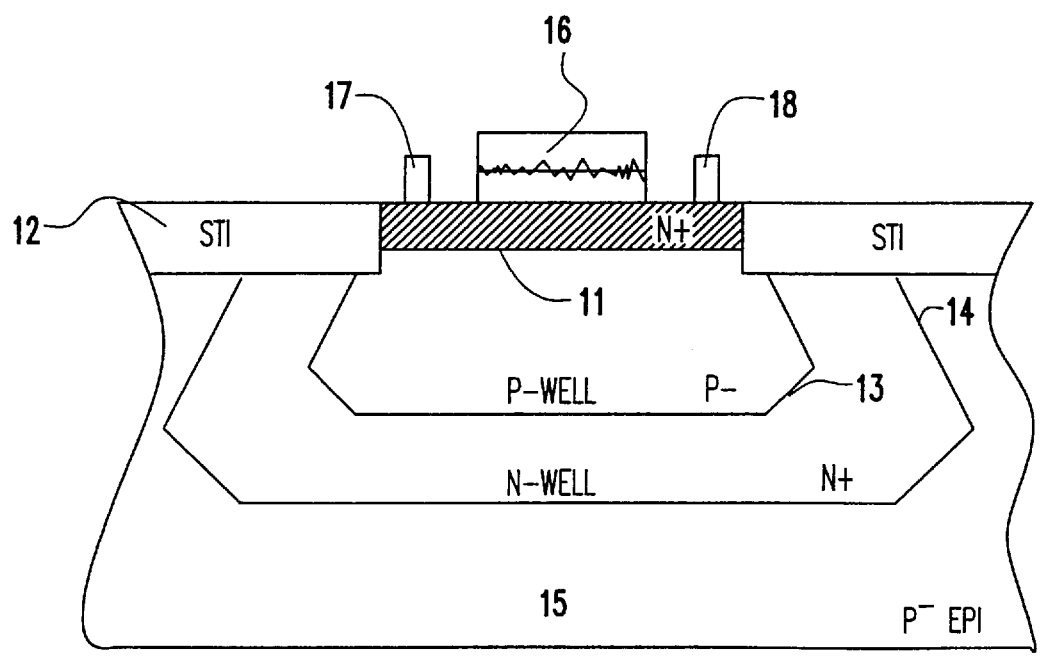
FIG. 2 is a cross-sectional view of the noise isolated buried resistor according to the invention.

Referring now to the drawings, and more particularly to FIGS. 1 and 2, there is shown in plan view and cross-sectional view, respectively, the buried resistor structure according to the invention. The area identified as 11 is an opening in a layer 12 of silicon dioxide ($SiO_2$). The $SiO_2$ serves as a shallow trench isolation (STI) for the resistor. The area identified as 13 denotes the area of a P-well as a so-called 'first well region' for purposes of this invention. The area identified as 14 denotes the area of an N-well as a so-called 'second well region' for purposes of this invention. As seen particularly in FIG. 2, the N-well is formed in a P-type epitaxial layer 15 on the substrate, for example with a boron implant, and the P-well 13 is formed within the N-well 14. The buried resistor is formed as an N+ implant in the area 11 with a polysilicon layer 16 overlying the N+ implant. The dimensions of the resistor are defined by the area 11 and the polysilicon layer 16. Specifically, as shown in FIG. 1, the length L of the resistor is the width of the polysilicon layer 16, and the width W of the resistor is the width of the area 11 defined by the opening in STI layer 12. The contacts 17 and 18 provide the input and output of the resistor.

The N-well 14 is a field shield that provides the noise isolation for the buried resistor according to the invention. In order to better understand the problem with the conventional buried resistor and why the invention provides noise isolation, the steps of manufacture of a conventional buried resistor will first be described.

Figure 3:
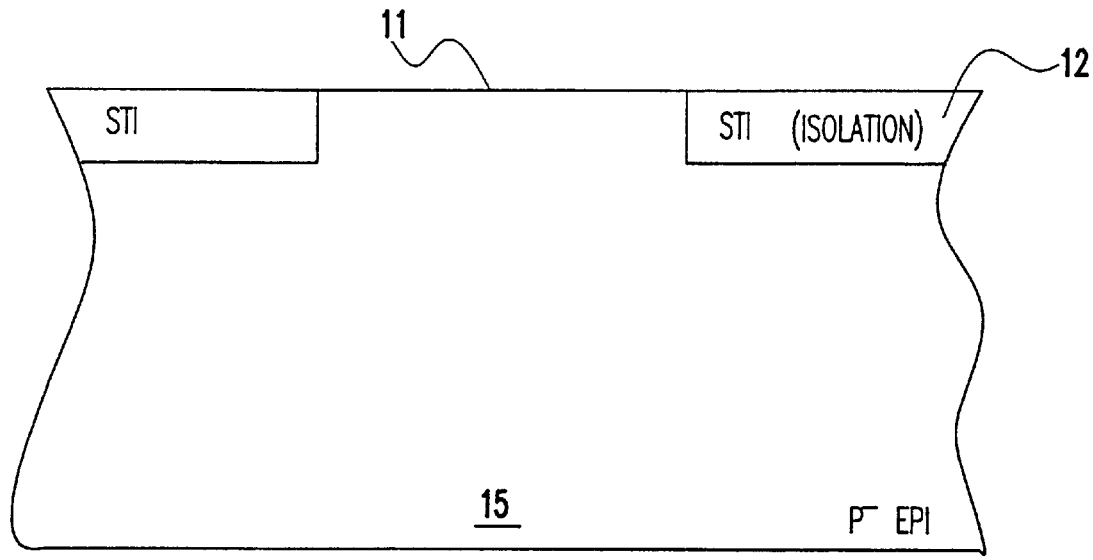
FIG. 3 is a cross-sectional view of the first step in the manufacture of a buried resistor.
Figure 4:
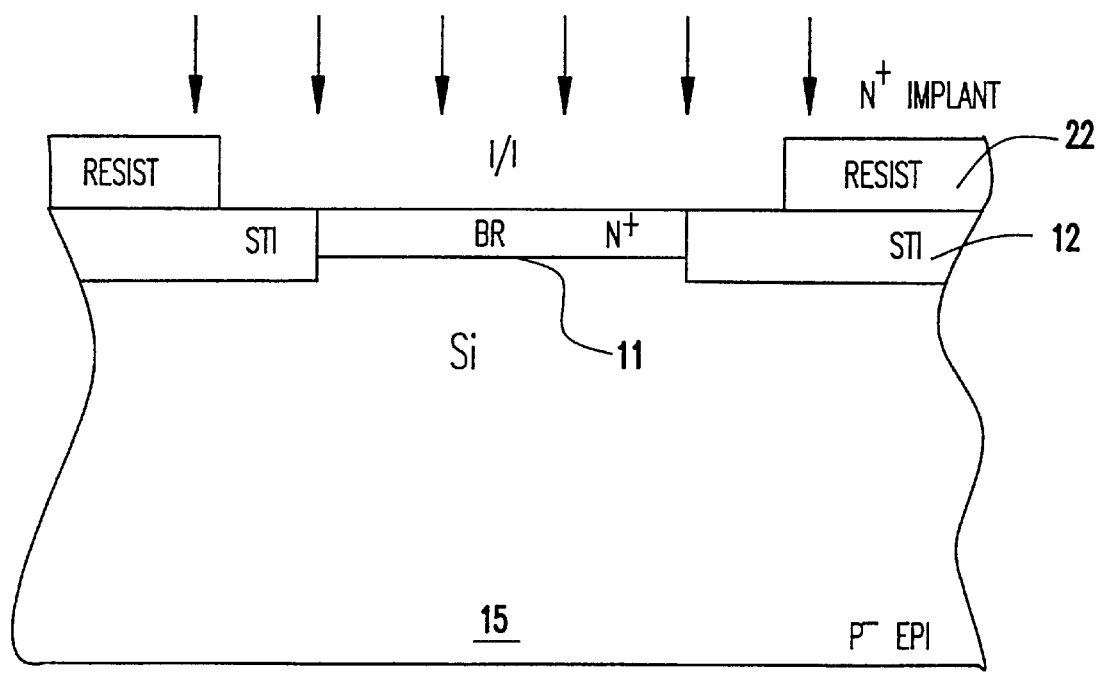
FIG. 4 is a cross-sectional view of the second step in the manufacture of a buried resistor.
Figure 5:
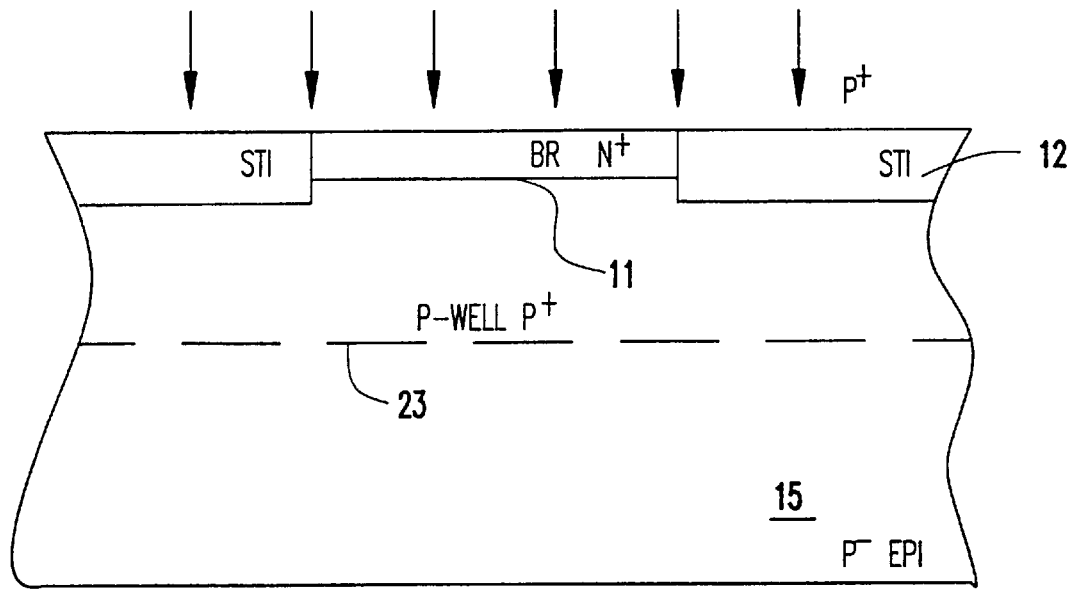
FIG. 5 is a cross-sectional view of the third step in the manufacture of a buried resistor.

In FIG. 3, the shallow trench isolation (STI) 12 defines an opening corresponding to the area 11 in a P-type epitaxial layer 15. In FIG. 4, a resist 22 is patterned on the STI 12. The opening in the resist 22 corresponds to the area 13 and serves as the mask for the N+ implant 23 forming the buried resistor. Note that while some of the implant will fall on exposed areas of the STI 12, it has no effect on the final structure of the resistor since the STI is an oxide. In FIG. 5, the resist is stripped, and a P-well implant is made to form the P-well 23 in the P-type epitaxial layer 15. Then in FIG. 6, a polysilicon layer 16 is formed over the N+ implant region 11. A silicide 24 is formed over the polysilicon layer 16 and silicon layer 11. The silicide has much lower sheet than doped silicon (i.e., layer 11). It can be formed by depositing metal such as titanium (Ti) or Cobalt (Co) on silicon and then sintering. Finally, in FIG. 7, the contacts 17 and 18 for the buried resistor are formed. These contacts may be part of a metallic layer. As can be seen in the resulting structure of FIG. 7, if there is noise in the substrate, i.e., the P-well, the buried N+ resistor will be coupled to the noise.

Figure 6:
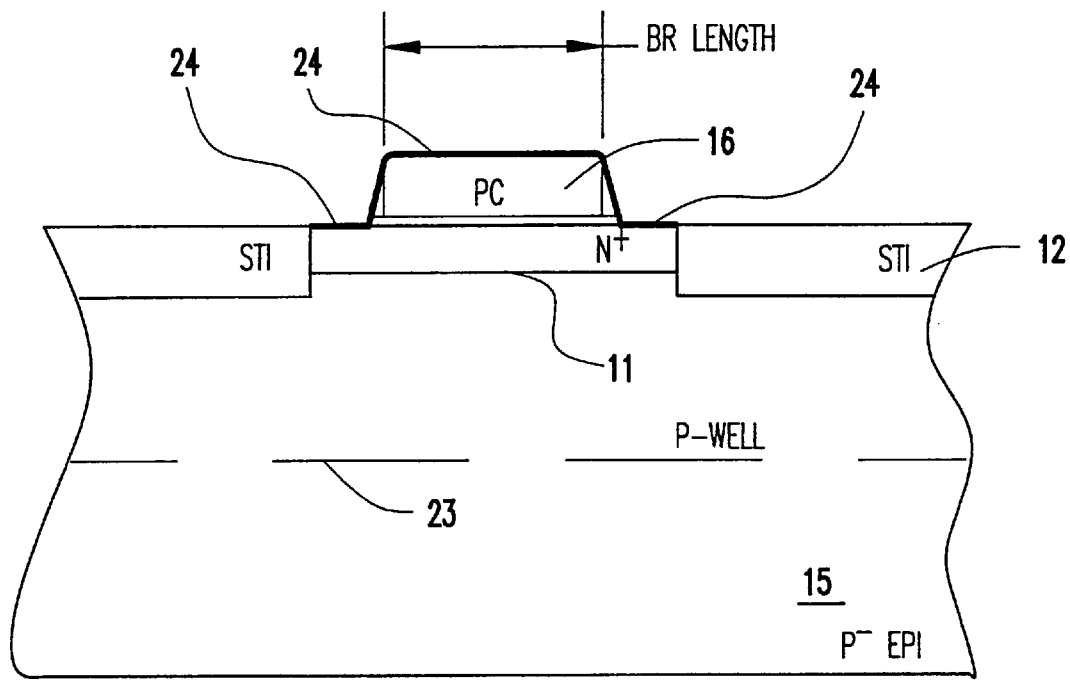
FIG. 6 is a cross-sectional view of the fourth step in the manufacture of a buried resistor.
Figure 7:
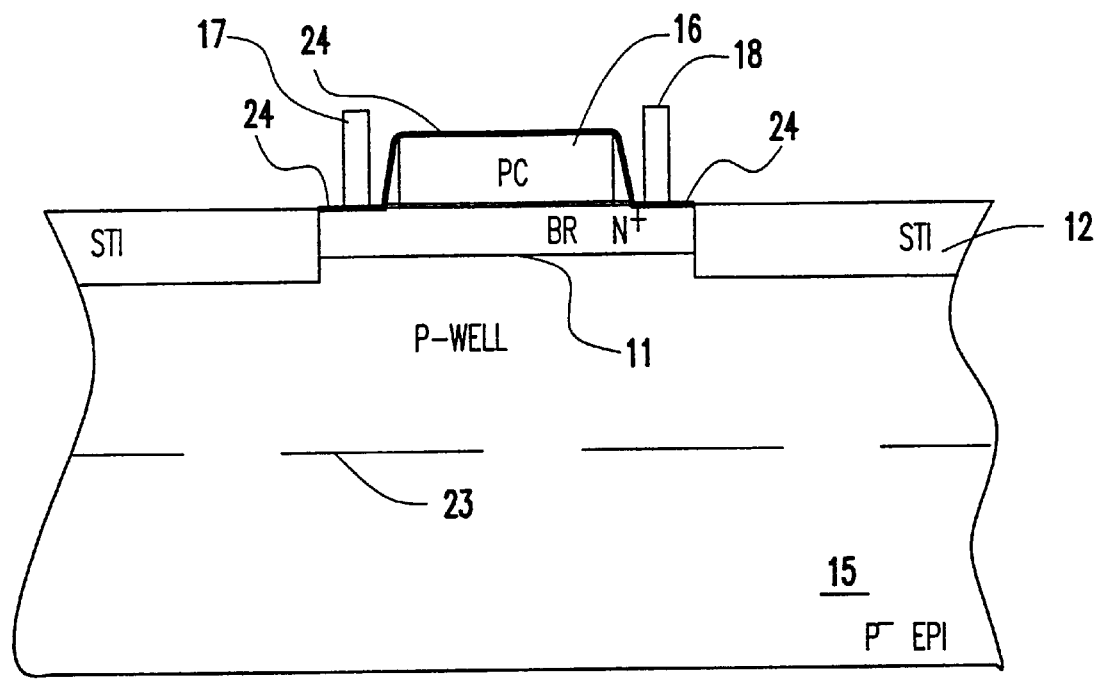
FIG. 7 is a cross-sectional view of the fifth step in the manufacture of a buried resistor.
Figure 8:
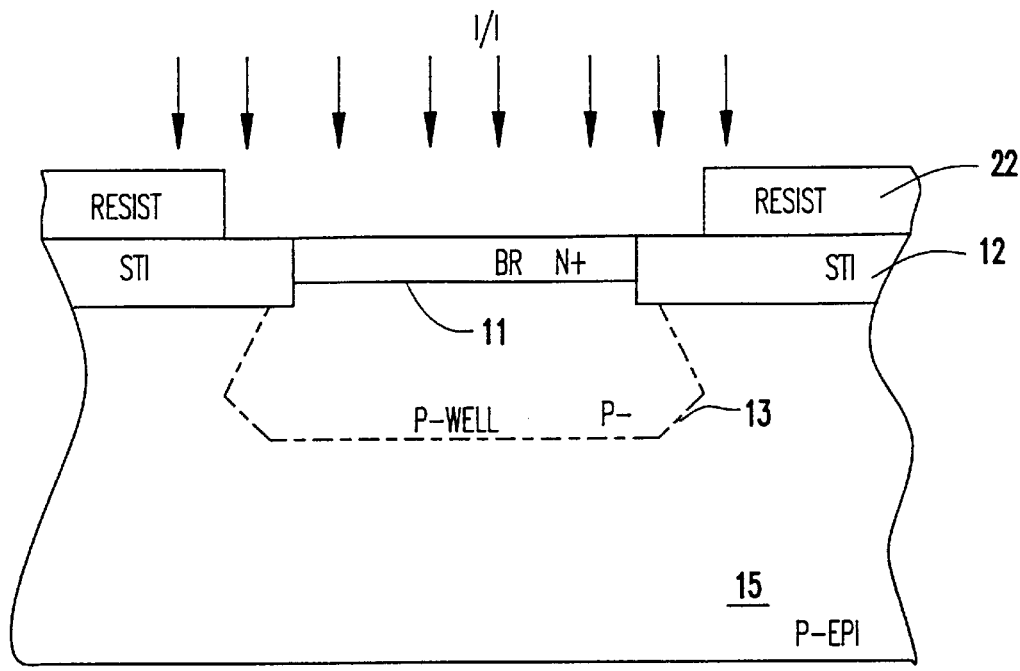
FIG. 8 is a cross-sectional view of the modification of the third step shown in FIG. 5 in the manufacture of the isolated buried resistor according to the invention.
Figure 9:
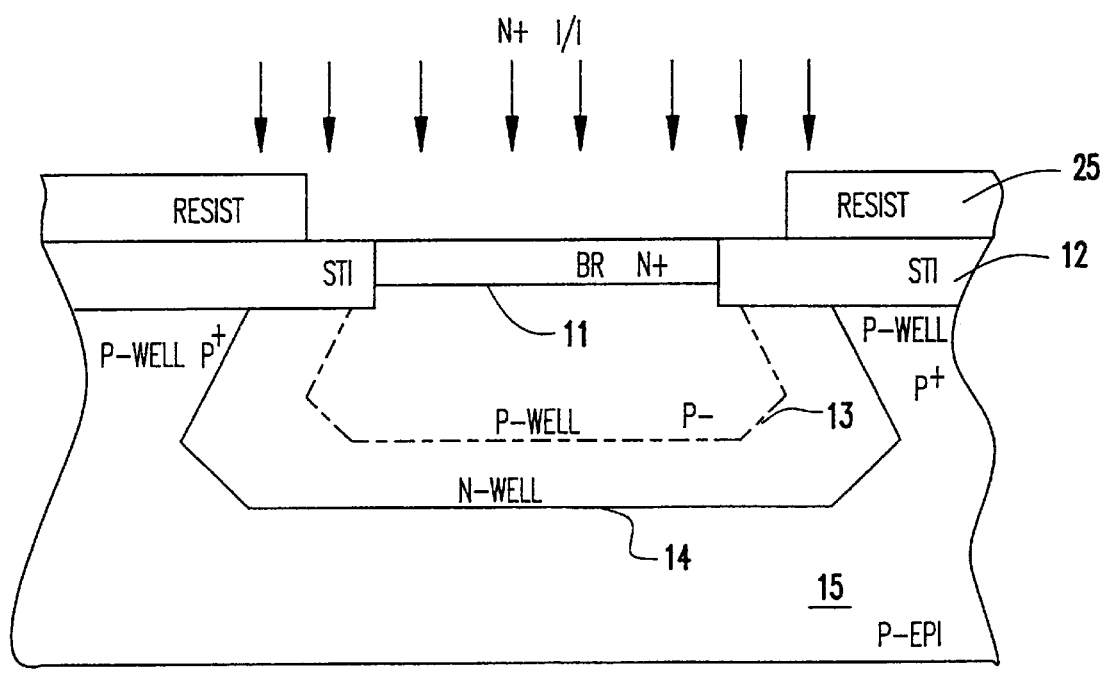
FIG. 9 is a cross-sectional view of an additional step in the manufacture of the isolated buried resistor according to the invention.

In the process according to this invention, the first step shown in FIG. 3 is the same. However, as shown in FIG. 8, the resist 22 added in the second step shown in FIG. 4 is not stripped before making the P-well implant, producing the P-well 13 after the N+ implant 11. The resist can be further patterned (e.g., by etching back the original opening) to produce a larger opening corresponding to the N-well 14. In the alternative, the original resist mask can be stripped and a new resist mask laid down. In either case, as shown in FIG. 9, an N-well is made with an N+ implant using the modified or new mask 25. The remaining steps corresponding to FIGS. 6 and 7 are then performed to produce the structure shown in FIGS. 1 and 2. By adding the N-well 14 as a field shield, the buried resistor is isolated from noise in the substrate (or P-type epitaxial layer 15), thus combining the advantages of buried resistors, such as compatibility to CMOS manufacturing technology and good heat dissipation, with low noise required by some analog circuits.

While the invention has been described in terms of a single preferred embodiment, those skilled in the art will recognize that the invention can be practiced with modification within the spirit and scope of the appended claims. For example, this invention also applies to the case where the substrate is N-type and the buried resistor is P-type. In this case, the P-well disclosed in the preferred embodiment becomes an N-well.

Having thus described our invention, what we claim as new and desire to secure by Letters Patent is as follows:

1. A method for forming a noise isolated buried resistor, comprising the steps of;

defining a first opening to a first conductivity type epitaxial layer with shallow trench isolation;

patterning a resist for forming a mask with an opening concentric with but larger than the first opening;

implanting a dopant to form a buried resistor of a second conductivity type;

using the mask to form a first well of said first conductivity type;

patterning the resist to form a mask with a larger opening; and implanting a dopant to form a second well of said second conductivity type, the first well being inside the second well and the second well providing noise isolation for the buried resistor.

2. The method recited in claim 1, wherein the first conductivity type is a P-type conductivity type and the second conductivity type is an N-type conductivity type.

3. The method recited in claim 1, further comprising:

forming at least two of said first well, said second well, and said epitaxial layer so that said at least two of said first well, said second well, and said epitaxial layer have surfaces which touch said shallow trench isolation.

4. The method recited in claim 1, further comprising:

forming said first well, said second well, and said epitaxial layer so that said first well, said second well, and said epitaxial layer have surfaces which touch said shallow trench isolation.

* * * * *